(12) United States Patent
Renz

(10) Patent No.: US 6,943,552 B2
(45) Date of Patent: Sep. 13, 2005

(54) MAGNETIC RESONANCE SYSTEM WITH A TRANSPORT ELEMENT, AN EXAMINATION TUNNEL AND AN OUTER ANTENNA ARRANGEMENT

(75) Inventor: Wolfgang Renz, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/830,467

(22) Filed: Apr. 21, 2004

(65) Prior Publication Data

US 2004/0212365 A1 Oct. 28, 2004

(30) Foreign Application Priority Data

Apr. 22, 2003 (DE) .......................... 103 18 190

(51) Int. Cl.[7] ................................ G01V 3/00
(52) U.S. Cl. ........................ 324/318; 324/322
(58) Field of Search .................. 324/318, 322, 324/309, 311, 307, 300; 600/421, 410

(56) References Cited

U.S. PATENT DOCUMENTS

| | | | |
|---|---|---|---|
| 5,065,760 A | * | 11/1991 | Krause et al. .............. 600/421 |
| 5,311,134 A | | 5/1994 | Yamagata et al. |
| 5,939,883 A | * | 8/1999 | Green et al. .............. 324/322 |
| 6,028,429 A | * | 2/2000 | Green et al. .............. 324/318 |

FOREIGN PATENT DOCUMENTS

EP      0 580 327      10/2001

* cited by examiner

Primary Examiner—Brij B. Shrivastav
(74) Attorney, Agent, or Firm—Schiff Hardin LLP

(57) ABSTRACT

A magnetic resonance system has a transport element by means of which an examination subject can be inserted into and removed from an examination tunnel. The examination tunnel is surrounded by an outer antenna arrangement, by means of which the examination subject can be excited to emit magnetic resonance signals, and which can receive these signals. In the examination tunnel, an auxiliary arrangement can be disposed that has a tunnel that, given arrangement of the auxiliary arrangement in the examination tunnel is parallel to the examination tunnel. with the auxiliary arrangement in the examination tunnel, the transport element still can be inserted into and removed from the examination tunnel. The auxiliary arrangement has an inner antenna arrangement that surrounds the tunnel thereof, and by means of which magnetic resonance signals excited in the examination subject can be received. The auxiliary arrangement also has an elastically yielding layer on its outer circumferential surface.

22 Claims, 3 Drawing Sheets

MAGNETIC RESONANCE SYSTEM WITH A TRANSPORT ELEMENT, AN EXAMINATION TUNNEL AND AN OUTER ANTENNA ARRANGEMENT

BACKGROUND OF THE INVENTION

1. Field of the Invention

The present invention concerns a magnetic resonance system of the type having a transport element, an examination tunnel or bore and an outer (external) antenna arrangement.

2. Description of the Prior Art

Magnetic resonance systems of the above type are known wherein by means of the transport element, an examination subject can be inserted into the examination tunnel and removed from the examination tunnel, the examination tunnel being surrounded by the outer antenna arrangement and wherein the examination subject inserted into the examination tunnel can be excited to magnetic resonance by means of the outer antenna arrangement, and magnetic resonance signals excited in the examination subject can be received by means of the antenna arrangement. Such magnetic resonance systems also are known that have auxiliary arrangement that can be disposed inside the examination tunnel, and that also form a tunnel that, with auxiliary arrangement inside the examination tunnel, is parallel to the examination tunnel. With the auxiliary arrangement inside the examination tunnel, the transport element still can be inserted into the tunnel of the auxiliary arrangement the examination tunnel and removed therefrom. The auxiliary arrangement has an internal antenna arrangement that surrounds the tunnel of the auxiliary arrangement and by means of which magnetic resonance signals excited in the examination subject can be received.

Such magnetic resonance systems are described, for example, In U.S. Pat. No. 5,311,134. When magnetic resonance signals excited in the examination subject are received with the outer antenna arrangement, the received magnetic resonance signals exhibit a relatively low signal-to-noise ratio. The signal-to-noise ratio normally is smaller the larger the cross-section of the examination tunnel.

To improve the reception quality, the use of local coils (for example head or knee coils) are also is known. Local coils provide a better signal-to-noise ratio, but only from a small reception area.

Local coils are complicated in their handling, relatively prone to interference, and also affect the examination subject (for example, a person to be examined). Furthermore, they can be used only when the magnetic resonance signal of interest arises exclusively from the examination subject that is adjacent to the local coil.

By contrast, when a larger part of the subject should be examined (for example for overview images), the receipt of the magnetic resonance signal ensues conventionally by means of the outer antenna arrangement, in spite of the relatively low signal-to-noise ratio.

From U.S. Pat. No. 5,311,134 and also from European Application 0 580 327, it is known to use a small inner (internal) antenna arrangement inserted into the examination tunnel instead of the outer antenna arrangement.

SUMMARY OF THE INVENTION

An object of the present invention is to provide a magnetic resonance system of the type initially described in which the auxiliary arrangement is held with an accurate fit in the examination tunnel in an optimally simple manner.

The object is in a magnetic resonance system of the type initially described wherein the auxiliary arrangement has an elastically yielding layer on its outer circumferential surface.

In an embodiment, the inner antenna arrangement has detuning elements by means of which it can be detuned, allowing the inner antenna arrangement to be switched as needed to a state in which it affects neither the excitation of magnetic resonances by the outer antenna arrangement nor the receipt of magnetic resonances by the outer antenna arrangement or local coils.

When the examination subject inserted into the examination tunnel can be excited to generate magnetic resonance signals by means of the inner antenna arrangement, the inner antenna arrangement can be completely used as a replacement for the outer antenna arrangement.

The inner antenna arrangement can be fashioned as a birdcage resonator, in which case it exhibits a very homogenous sensitivity for reception. In the transmission mode, it very uniformly excites the spins in the examination subject to magnetic resonance. Alternatively, it is possible for the inner antenna arrangement to be fashioned as an antenna array. This is particularly meaningful when the inner antenna arrangement is operated only as a reception antenna.

The examination tunnel normally has at least two guide elements for the transport element. In this case, a simple design of the auxiliary arrangement results in an embodiment wherein it has two arrangement parts, each of the arrangement parts being disposed between two of the guide elements, and a portion of the circumference (specific for the respective arrangement part) of the examination tunnel can be covered by each arrangement part. It is alternatively possible to form the auxiliary arrangement as a single part having recesses for the passage of the guide elements.

The examination tunnel normally exhibits a circular cross-section. Relative to the examination tunnel, the auxiliary tunnel can exhibit a geometrically similar cross-section, thus a circular cross-section with smaller diameter. Alternatively, it can exhibit a geometrically dissimilar cross-section. In particular, it is possible for the auxiliary tunnel to exhibit, for example, an elliptical or oval cross-section. Given a non-circular cross-section, the open (unobstructed) width of the auxiliary tunnel is greater than its open height.

In an embodiment wherein the auxiliary arrangement exhibits an outer contour that corresponds with an inner contour of the examination tunnel, the auxiliary arrangement can be particularly simply handled. In particular, in this case it is not necessary to attach it in the examination tunnel. Rather, it is sufficient to simply insert it into the examination tunnel. The required immobility can be ensured by the dead weight of the auxiliary arrangement.

In a further embodiment the auxiliary arrangement is fashioned to dampen sound, for example by elastically yielding layer being fashioned as a sound-dampening layer. This increases the comfort of the examination subject (the patient) in the examination.

The application of the present invention is particularly useful when the examination tunnel exhibits an open width that is greater than 60 cm, in particular at least 70 cm. By contrast, the auxiliary tunnel should exhibit a width that is smaller than 60 cm, in particular maximally 50 or 55 cm.

DESCRIPTION OF THE PREFERRED EMBODIMENTS

Figure 1:
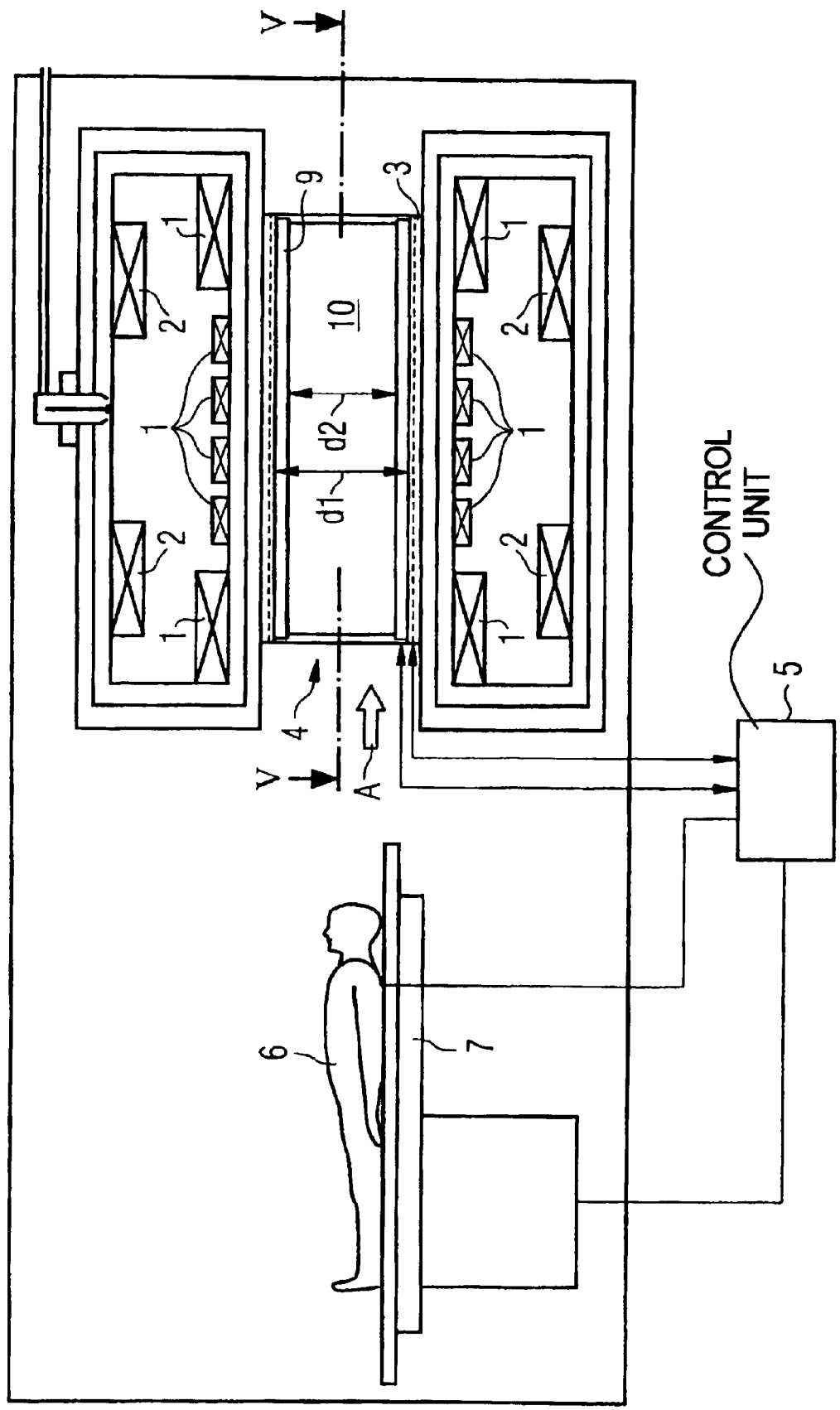
FIG. 1 schematically illustrates, the assembly of a magnetic resonance system according to the present invention.

As shown in FIG. 1, a magnetic resonance system has a magnet arrangement that includes, among other things, a basic field magnet 1, a shielding magnet 2, a gradient coil arrangement (not shown) and an outer antenna arrangement 3.

The basic field magnet 1 generates in an examination region 4, a homogenous, time-constant basic magnetic field. The shielding magnet 2 shields the basic field magnet 1 from exterior magnetic fields.

The outer antenna arrangement 3 can be controlled by a control device 5 to generate, in the examination region 4, a homogenous, radio-frequency field for exciting magnetic resonance signals in an examination subject. The examination subject—normally a person 6—thus can be excited to exit magnetic resonance signals when introduced into the examination region 4. The magnetic resonance signals can be received by the outer antenna arrangement 3 and conveyed to the control device 5.

A spatial coding of the excited magnetic resonances ensues in a known manner by means of the gradient coil arrangement. The control of the gradient coil arrangement also ensues via the control device 5.

Figure 2:
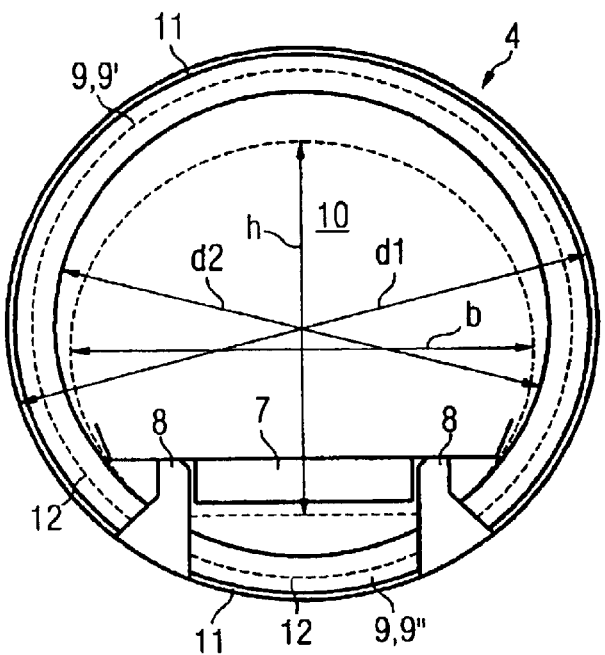
FIG. 2 is a view of the magnetic resonance system of FIG. 1 from the direction A shown in FIG. 1.

The outer antenna arrangement 3 normally is fashioned as a birdcage resonator and, according to FIG. 2, is internally lined with a cladding. The lining therefore defines an examination tunnel that is identical with the examination region 4. The examination region 4 is thus surrounded by the outer antenna arrangement 3.

As shown in FIG. 1, the examination subject can be inserted into and removed from the examination tunnel 4 by means of a transport element 7 (patient bed). According to FIG. 2, the transport element 7 is guided by two guide elements 8 (for example, slide rails) that are arranged or attached in the examination tunnel 4.

The examination tunnel 4 normally exhibits a circular cross-section. Its diameter d1 is typically more than 60 cm, for example 65, 70 or 75 cm. The outer antenna arrangement 3 thus exhibits a diameter that must be—at least negligibly—greater than the diameter d1 of the examination tunnel 4. Due to the size of the outer antenna arrangement 3, magnetic resonance signals can be received by it only with relatively low spatial resolution, and above all only with a relatively low signal-to-noise ratio.

In order to improve the signal-to-noise ratio in the magnetic resonance reception, the magnetic resonance system has an auxiliary arrangement 9. As shown in FIG. 2, this auxiliary arrangement 9 is disposed in the examination tunnel 4 such that it can be removed. It can only be removed as a whole from the examination tunnel 4, but it has no moving elements, in particular no elements that can engage the examination subject 6. It is thus—in contrast to local coils—not fixed to the patient 6 or transport element 7, but rather is fixed to the system.

The auxiliary arrangement 9 has a tunnel 10. The tunnel 10 runs parallel to the examination tunnel 4 when the auxiliary arrangement 9 is disposed in the examination tunnel 4. The cross-section of the tunnel 10 is naturally smaller than the examination tunnel 4.

The auxiliary arrangement 9 has on its outside a sound-dampening layer 11, for example a foam layer fashioned to dampen sound. With this layer 11, the auxiliary arrangement 9 thus abuts the entire inner circumference of the examination tunnel 4. The auxiliary arrangement 9 thus exhibits an outer contour that corresponds to the inner contour of the examination tunnel 4.

As also can be seen from FIG. 2, the auxiliary arrangement 9 is fashioned such that the transport element 7 also can be inserted into and removed from the examination tunnel 4 when the auxiliary arrangement 9 is arranged in the examination tunnel 4.

The auxiliary arrangement 9 has an inner antenna arrangement 12 that surrounds the additional tunnel but is arranged within the examination tunnel 4, and thus closer to the examination subject 6 than the outer antenna arrangement 3. Magnetic resonance signals excited in the examination subject 6 thus can be received by the inner antenna arrangement 12 with somewhat higher spatial resolution, and above all with a better signal-to-noise ratio, than with the outer antenna arrangement 3.

Figure 3:
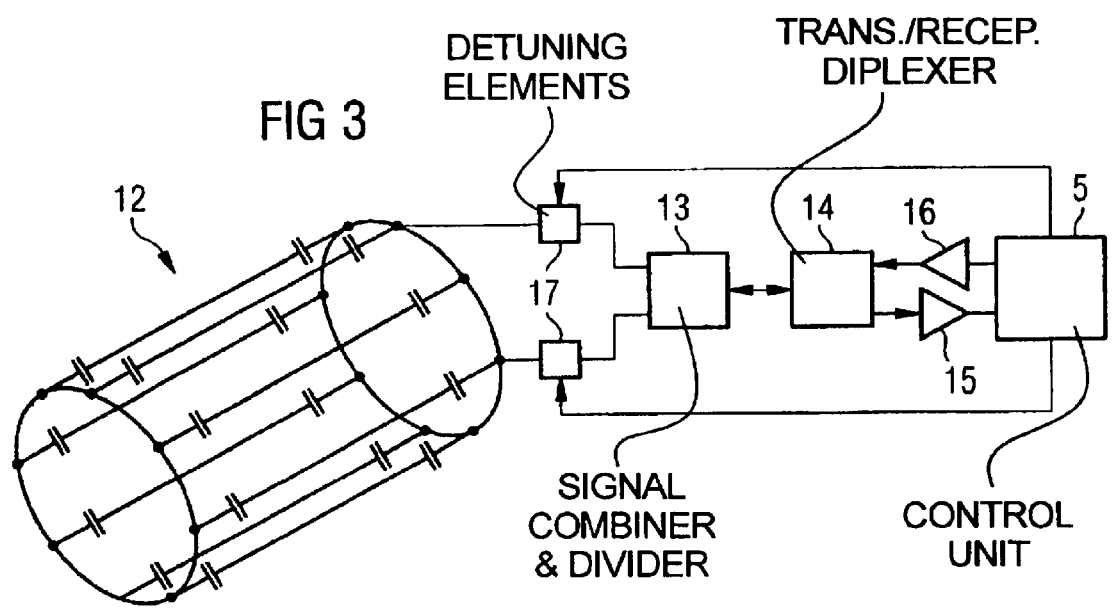
FIG. 3 schematically illustrates, an inner antenna arrangement according to the invention.

According to FIG. 3, the inner antenna arrangement 12 is fashioned, for example, as a birdcage resonator. It can be operated as a reception arrangement by a signal combiner and divider 13 with an integrated 90° phase shifter, a transmission and reception diplexer 14, and a pre-amplifier 15. Via a power amplifier 16, the transmission and reception diplexer 14 and the signal combiner and divider 13, it is also possible to operate the inner antenna arrangement 12 as a transmission antenna by means of which the examination subject 6 can be excited to emit magnetic resonance signals when it is inserted into the examination tunnel 4 (or in the tunnel 10).

According to FIG. 3, the inner antenna arrangement 12 has detuning elements 17. The inner antenna arrangement 12 can be detuned by means of the detuning elements, such that it does not interfere with the transmission and reception behavior of the outer antenna arrangement 3 when the latter is operated.

Figure 4:
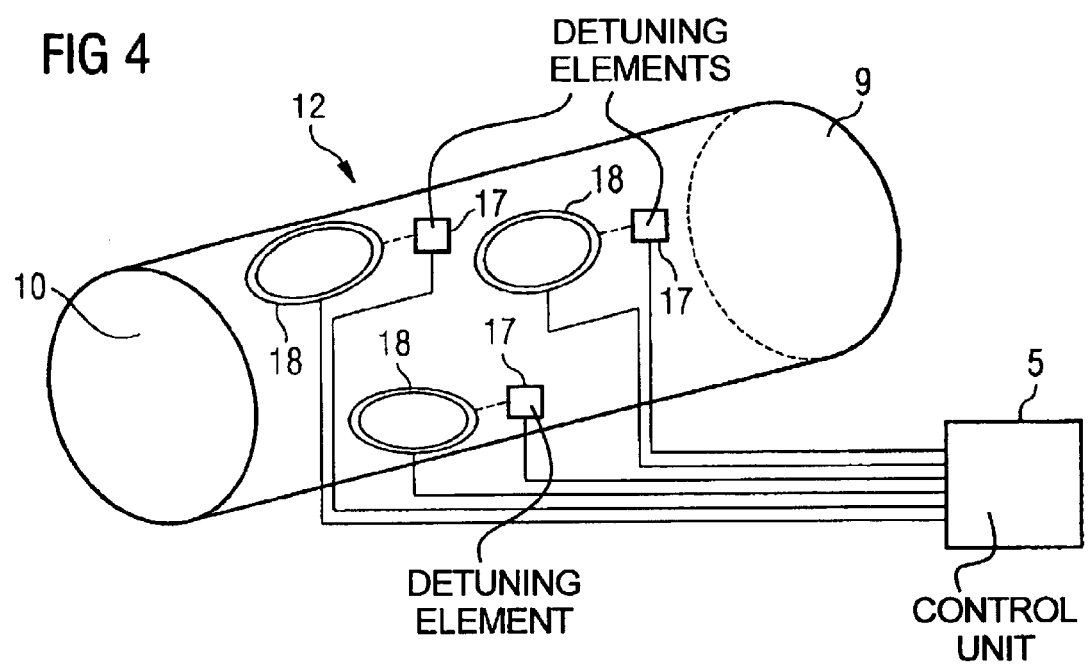
FIG. 4 schematically illustrates an alternative embodiment of an inner antenna arrangement according to the present invention.

As an alternative to the embodiment according to FIG. 3, the inner antenna arrangement 12 according to FIG. 4 can be fashioned as an antenna array with individual antennas 18. In this case, the inner antenna arrangement 12 preferably is used exclusively as a reception arrangement. In this case, however, detuning elements 17, by means of which the individual antennas 18 can be detuned, are also associated with the individual antennas 18.

According to FIG. 2, the auxiliary arrangement 9 has two arrangement parts 9', 9" separated from one another. Each of the arrangement parts 9', 9" is disposed between two of the guide elements 8 for the transport element 7 and covers a portion of the circumference of the examination tunnel 4 that is specific for the respective arrangement part 9', 9".

According to FIG. 2, the tunnel 10—just like the examination tunnel 4—exhibits a circular cross-section. Its cross-section is thus geometrically similar to that of the examination tunnel 4. The diameter d2 of the tunnel 10 naturally is smaller than that of the examination tunnel 4. In particular, it is normally smaller than 60 cm and is, for example, only 50 or 55 cm.

As indicated in FIG. 2 with the dashed lines, the tunnel 10 alternatively can exhibit a non-circular cross-section. In this case, the cross-section of the additional tunnel 10 is geometrically dissimilar to the (circular) cross-section of the examination tunnel 4. For example, the additional tunnel 10 could exhibit an elliptical or an oval cross-section.

In the case of a non-circular cross-section, the tunnel 10 exhibits an open height h and open width b that are different from one another. The open width b is preferably greater than the open height h.

The embodiment of the tunnel 10 with a non-circular cross-section can be realized as an alternative to the embodiment with the circular cross-section. It also can be realized—for example, given provision of two auxiliary arrangements 9 different from one another—in addition to the embodiment of the tunnel 10 with a circular cross-section.

Figure 5:
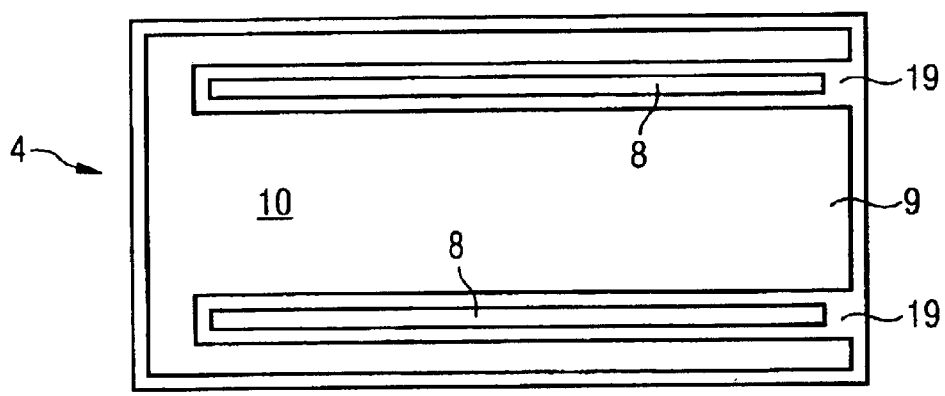
FIG. 5 shows a section through an alternative embodiment of a magnetic resonance system along a line V—V in FIG. 1.

According to FIG. 5, it is also possible—as an alternative to the embodiment of the auxiliary arrangement 9 with two arrangement parts 9', 9"—to fashion the auxiliary arrangement 9 as a single part. In this case, the auxiliary arrangement 9 has recesses 19 through which the guide elements 8 can pass.

The auxiliary arrangement 9 and the arrangement parts 9', 9" are relatively light. They maximally weigh 10 to 15 kg. It is possible for attachment elements to be present by means of which the auxiliary arrangement 9 can be attached, for example braced—preferably tool-free—in the examination tunnel 4. Preferably, however, it is held in the in the examination tunnel 4 only loosely by its dead weight. In particular, it can be held with accurate fit in the examination tunnel 4 due to the elastically yielding layer 11. In each case, the auxiliary arrangement 9 should be installable and uninstallable without difficulty.

Magnetic resonance signals can be received by means of the inventive magnetic resonance system in a large examination region 4 with improved signal-to-noise ratio without requiring that local coils be arranged on the patient 6.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance system comprising:
   a magnetic resonance scanner having an examination tunnel;
   a transport element adapted to receive an examination subject thereon, said transport element being movable into and out of said examination tunnel;
   an antenna arrangement in said scanner at least partially surrounding said examination tunnel for exciting magnetic resonance signals in, and receiving said magnetic resonance signals from, the examination subject when in the examination tunnel on the transport element;
   an auxiliary arrangement disposed in said examination tunnel and forming an auxiliary tunnel parallel to said examination tunnel into and from which the examination subject is movable by said transport element;
   said auxiliary arrangement having an internal antenna arrangement at least partially surrounding said auxiliary tunnel and with which at least said magnetic resonance signals can be received; and
   said auxiliary arrangement having an outer circumferential surface with an elastically yielding layer on said outer circumferential surface disposed for mechanically interacting with said examination tunnel.

2. A magnetic resonance system as claimed in claim 1 wherein said inner antenna arrangement comprises detuning elements, allowing detuning of said inner antenna arrangement with respect to said outer antenna arrangement.

3. A magnetic resonance system as claimed in claim 1 wherein said inner antenna arrangement also is operable for exciting said magnetic resonance signals in the examination subject.

4. A magnetic resonance system as claimed in claim 1 wherein said inner antenna arrangement comprises a birdcage resonator.

5. A magnetic resonance system as claimed in claim 1 wherein said inner antenna arrangement comprises an antenna array.

6. A magnetic resonance system as claimed in claim 1 comprising a plurality of guide elements for said transport element disposed in said examination tunnel.

7. A magnetic resonance system as claimed in claim 6 wherein said auxiliary arrangement comprises at least two arrangement parts each disposed between two of said guide elements and each covering a portion of the circumference of the examination tunnel.

8. A magnetic resonance system as claimed in claim 6 wherein said auxiliary arrangement is a unitary component, and comprises respective recesses for passage of said guide elements.

9. A magnetic resonance system as claimed in claim 1 wherein said examination tunnel has a circular cross-section.

10. A magnetic resonance system as claimed in claim 1 wherein said examination tunnel has a cross-section, and wherein said auxiliary tunnel has a cross-section that is geometrically dissimilar to said cross-section of said examination tunnel.

11. A magnetic resonance system as claimed in claim 1 wherein said examination tunnel has a circular cross-section and wherein said auxiliary tunnel has a non-circular cross-section.

12. A magnetic resonance system as claimed in claim 11 wherein said auxiliary tunnel has a non-circular cross-section selected from the group consisting of an elliptical cross-section and an oval cross-section.

13. A magnetic resonance system as claimed in claim 11 wherein said auxiliary tunnel has an open height and an open width, with said open width being larger than said open height.

14. A magnetic resonance system as claimed in claim 1 wherein said examination tunnel has an inner contour, and wherein said auxiliary arrangement has an outer contour conforming to said inner contour of said examination tunnel.

15. A magnetic resonance system as claimed in claim 1 wherein said auxiliary arrangement comprises a sound dampening component.

16. A magnetic resonance system as claimed in claim 15 wherein said sound dampening component comprises said elastically yielding layer.

17. A magnetic resonance system as claimed in claim 1 wherein said examination tunnel has an open width that is greater than 60 cm.

18. A magnetic resonance system as claimed in claim 17 wherein said open width is in a range between 65 cm and 70 cm.

19. A magnetic resonance system as claimed in claim 1 wherein said auxiliary tunnel has an open width that is smaller than 60 cm.

20. A magnetic resonance system as claimed in claim 19 wherein said open width of said auxiliary tunnel is a maximum of 55 cm.

21. A magnetic resonance system as claimed in claim 19 wherein said open width of said auxiliary tunnel is a maximum of 50 cm.

22. An auxiliary arrangement adapted for insertion into an examination tunnel of a magnetic resonance scanner, said auxiliary arrangement comprising:

an auxiliary arrangement body forming a tunnel adapted to receive an examination subject therein;

an antenna arrangement carried by said body and at least partially surrounding said tunnel; and said body having an exterior surface with an elastically yielding layer thereon adapted to interact with said examination tunnel.

\* \* \* \* \*